United States Patent
Azzouz et al.

(10) Patent No.: US 9,698,330 B2
(45) Date of Patent: Jul. 4, 2017

(54) THERMOELECTRIC DEVICE, IN PARTICULAR INTENDED TO GENERATE AN ELECTRIC CURRENT IN A MOTOR VEHICLE

(75) Inventors: Kamel Azzouz, Paris (FR); Michel Simonn, Voisins le Bretonneux (FR)

(73) Assignee: VALED SYSTEMES THERMIQUES, Le Mesnil Saint Denis (FR)

( * ) Notice: Subject to any disclaimer, the term of this patent is extended or adjusted under 35 U.S.C. 154(b) by 944 days.

(21) Appl. No.: 13/876,685

(22) PCT Filed: Jul. 28, 2011

(86) PCT No.: PCT/EP2011/063029
§ 371 (c)(1),
(2), (4) Date: Sep. 25, 2013

(87) PCT Pub. No.: WO2012/041561
PCT Pub. Date: Apr. 5, 2012

(65) Prior Publication Data
US 2014/0007916 A1    Jan. 9, 2014

(30) Foreign Application Priority Data
Sep. 29, 2010 (FR) ...................................... 10 57875

(51) Int. Cl.
*H01L 35/30*   (2006.01)
*F01N 5/02*    (2006.01)

(52) U.S. Cl.
CPC .............. *H01L 35/30* (2013.01); *F01N 5/025* (2013.01)

(58) Field of Classification Search
CPC ..................................................... H01L 30/35
See application file for complete search history.

(56) References Cited

U.S. PATENT DOCUMENTS

| | | | |
|---|---|---|---|
| 5,584,183 A | 12/1996 | Wright et al. | |
| 6,799,282 B2* | 9/2004 | Maeda | F28D 15/02 136/201 |

(Continued)

FOREIGN PATENT DOCUMENTS

| | | |
|---|---|---|
| EP | 1515376 A2 | 3/2005 |
| WO | WO 96/11372 A1 | 4/1996 |

(Continued)

OTHER PUBLICATIONS

English language abstract for EP 1515376 extracted from the espacenet.com database on Jun. 7, 2013, 9 pages.

(Continued)

*Primary Examiner* — Jayne Mershon
(74) *Attorney, Agent, or Firm* — Howard & Howard Attorneys PLLC (57) ABSTRACT

The invention relates to a thermoelectric device, comprising pipes (8), called hot pipes, through which a first fluid can flow, and elements (3p, 3n), called thermoelectric elements, that can be used to generate an electric current in the presence of a temperature gradient. According to the invention, it comprises fins (5p, 5n) that can be configured in a heat exchange relationship with pipes (9), called cold pipes, through which a second fluid can flow at a temperature lower than that of the first fluid, and in that the thermoelectric elements (3p, 3n) are in contact, on the one hand, with the hot pipes (8) and, on the other hand, with the fins (5p, 5n), such that said thermoelectric elements (3p, 3n) generate said current.

19 Claims, 4 Drawing Sheets

(56) References Cited

U.S. PATENT DOCUMENTS

| | | | |
|---|---|---|---|
| 2005/0087222 A1* | 4/2005 | Muller-Werth | H01L 35/32 136/224 |
| 2007/0220902 A1 | 9/2007 | Matsuoka et al. | |
| 2011/0154811 A1 | 6/2011 | Simonnin | |

FOREIGN PATENT DOCUMENTS

| | | |
|---|---|---|
| WO | WO 2009/156361 A1 | 12/2009 |
| WO | WO 2012/041559 A1 | 4/2012 |
| WO | WO 2012/041560 A1 | 4/2012 |
| WO | WO 2012/041562 A1 | 4/2012 |
| WO | WO 2012041558 A1 | 4/2012 |

OTHER PUBLICATIONS

English language abstract for WO 2009/156361 extracted from the espacenet.com database on Jun. 7, 2013, 40 pages.

English language abstract and machine-assisted English translation for WO 2012041558 extracted from the espacenet.com database on Jun. 10, 2013, 43 pages.

English language abstract and machine-assisted English translation for WO 2012041559 extracted from the espacenet.com database on Jun. 10, 2013, 46 pages.

English language abstract and machine-assisted English translation for WO 2012041560 extracted from the espacenet.com database on Jun. 10, 2013, 42 pages.

English language abstract and machine-assisted English translation for WO 2012/041562 extracted from the espacenet.com database on Jun. 11, 2013, 52 pages.

International Search Report for Application No. PCT/EP2011/063021 dated Aug. 17, 2011; 5 pages.

International Search Report for Application No. PCT/EP2011/063025 dated Aug. 29, 2011; 5 pages.

International Search Report for Application No. PCT/EP2011/063026 dated Aug. 17, 2011; 5 pages.

International Search Report for Application No. PCT/EP2011/063029 dated Aug. 29, 2011; 5 pages.

International Search Report for Application No. PCT/EP2011/063033 dated Aug. 29, 2011; 7 pages.

* cited by examiner

THERMOELECTRIC DEVICE, IN PARTICULAR INTENDED TO GENERATE AN ELECTRIC CURRENT IN A MOTOR VEHICLE

RELATED APPLICATIONS

This application is the National Stage of International Patent Application No. PCT/EP2011/063029, filed on Jul. 28, 2011, which claims priority to and all the advantages of French Patent Application No. FR 10/57875, filed on Sep. 29, 2010, the content of which is incorporated herein by reference.

The present invention relates to a thermoelectric device, intended in particular to generate an electric current in a motor vehicle.

BACKGROUND

Thermoelectric devices have already been proposed that use elements, called thermoelectric elements, that can be used to generate an electric current in the presence of a temperature gradient between two of their opposing faces through the phenomenon known as the Seebeck effect. These devices comprise a stack of first pipes, intended for the circulation of the exhaust gases from an engine, and second pipes, intended for the circulation of a heat-transfer fluid of a cooling circuit. The thermoelectric elements are sandwiched between the pipes so as to be subjected to a temperature gradient originating from the temperature difference between the hot exhaust gases and the cold coolant.

Such devices are particularly interesting because they make it possible to produce electricity from a conversion of the heat originating from the exhaust gases of the engine. They thus offer the possibility of reducing the fuel consumption of the vehicle by replacing, at least partially, the alternator usually provided therein in order to generate electricity from a belt driven by the crankshaft of the engine.

One drawback of the known devices is that they require a very good contact to be ensured between the thermoelectric elements and the pipes. It is thus necessary to have pipes that have a flatness and a surface finish that have an impact on the cost price of the device.

A first solution, consisting in reinforcing the contact by virtue of tie rods exerting a force on the stack of pipes, has been tested. This solution does, however, entail using pipes that do not present a risk of being crushed on one another under the effect of this force, resulting in an overconsumption of material.

The invention aims to improve the situation by proposing a thermoelectric device, comprising pipes, called hot pipes, through which a first fluid can flow, and elements, called thermoelectric elements, that can be used to generate an electric current in the presence of a temperature gradient.

SUMMARY OF THE INVENTION

According to the invention, it comprises fins, that can be configured in a heat exchange relationship with pipes, called cold pipes, through which a second fluid can flow at a temperature lower than that of the first fluid, and in that the thermoelectric elements are in contact, on the one hand, with the hot pipes and, on the other hand, with the fins, such that said thermoelectric elements generate said current.

By associating the thermoelectric elements with fins, the intimacy of the contact is facilitated. In practice, the need to establish a close link between the thermoelectric elements and the component or components creating the temperature gradient is necessary to their operation is no longer supported solely by the fluid circulation pipes but by a specific component, the fins, which can therefore be chosen for this purpose. The technical solutions used to establish an effective heat bridge between, on the one hand, the fins and the cold pipes and, on the other hand, the fins and the thermoelectric elements, will therefore be able to be optimized separately.

Moreover, by retaining a direct contact between the hot pipe and the thermoelectric elements, that is to say a contact without the intermediary of fins, it becomes possible to use a pipe suited to the flow of a hot fluid, possibly corrosive, such as exhaust gases of an engine.

According to different embodiments:

said hot pipes have at least one planar face and said thermoelectric elements are provided on said face or faces, said hot pipes are substantially flat and have two opposing planar faces, said thermoelectric elements being provided on said planar faces, said hot pipes have a plurality of channels for the passage of the first fluid, separated by partitions linking the opposing planar faces of the pipes, said hot pipes are made of stainless steel, the thermoelectric elements are, for a first part, of a first type, called P, making it possible to establish an electrical potential difference in one direction, called positive, when they are subjected to a given temperature gradient, and, for the other part, of a second type, called N, making it possible to create an electrical potential difference in an opposite direction, called negative, when they are subjected to the same temperature gradient, each planar face of the hot pipes has associated with it at least two so-called fins, called neighboring fins, provided facing said face, a plurality of said thermoelectric elements are provided, arranged between the planar face and the neighboring fins of said planar face, the P-type thermoelectric elements of said plurality of thermoelectric elements are provided between a first of said two fins, called P-type fin, and said planar face, the N-type thermoelectric elements of said plurality of thermoelectric elements are provided between the other of said two fins, called N-type fin, and said planar face, so as to create a potential difference between said first and other fins, said hot pipes are superposed in a number of ranks R in a first direction orthogonal to the fins, some of said fins, called internal fins, are provided between said hot pipes, a pair of said internal fins being located between two successive hot pipes of one and the same rank R, the fins of one and the same pair being separated by a compressible material, said cold pipes are round or oval, the hot pipes of a so-called rank R are arranged between two ranks of said cold pipes, the cold pipes of a first of said two ranks of cold pipes being in a heat exchange relationship with the fins provided on a first side of the hot pipes of said rank R and the cold pipes of the second of said two ranks of cold pipes being in a heat exchange relationship with the fins provided on the other side of the hot pipes of said rank R.

According to a first exemplary implementation, said P-type fins are located facing one another on either side of one and the same hot pipe and said N-type fins are located on either side of said same hot pipe, said P-type and N-type fins being respectively connected together electrically so as to set the thermoelectric elements of one and the same type located on either side of said pipe at the same potential.

According to this first exemplary embodiment, it will be possible to provide for:

the hot pipes to be situated facing one another from one rank R of hot pipes to the other so as to form a series S of hot pipes located in the extension of one another in a direction of transversal extension of the fins, the fins of one and the same type located on either side of one and the same hot pipe of a rank R of hot pipes are situated facing fins of one and the same type located on either side of the hot pipe situated opposite in the rank R of neighboring hot pipes, in the same series S of hot pipes, said fins of one and the same type located on either side of one and the same hot pipe of a rank R of hot pipes and the fins situated facing one another in the rank R of neighboring hot pipes are set to the same potential, said fins of one and the same type located on either side of one and the same hot pipe of a rank R of hot pipes and the fins situated facing one another in the rank R of neighboring hot pipes are, respectively, fins of different type, P or N, the fins situated at the end of a series S of hot pipes are set to the same potential as the fins situated at the end of the neighboring series S of hot pipes, on one side of said series S of hot pipes, two ranks of cold pipes are provided between each rank R of hot pipes.

According to another exemplary implementation, said P-type fins are located facing said N-type fins on either side of one and the same hot pipe.

According to this other exemplary embodiment, it will be possible to provide for:

the hot pipes to be situated facing one another from one rank R of hot pipes to the other so as to form a series S of hot pipes located in the extension of one another in a direction of transversal extension of the fins (as in the first embodiment), the P-type, respectively N-type, fins of a so-called hot pipe are merged with the N-type, respectively P-type, fins of the neighboring hot pipe of the same series S of hot pipes, the fins located on either side of the hot pipe situated at the end of a series S of hot pipes are electrically connected together in series, a rank of cold pipes is provided between each rank R of hot pipes.

BRIEF DESCRIPTION OF THE DRAWINGS

The invention will be better understood in light of the following description which is given purely as an indication and which is in no way intended to limit it, accompanied by the attached drawings in which.

As illustrated by the figures, the invention relates to a thermoelectric device, comprising a first circuit 1, called hot circuit, through which a first fluid can flow, notably exhaust gases of an engine, and a second circuit 2, called cold circuit, through which a second fluid can flow, notably a heat transfer fluid of a cooling circuit, at a temperature lower than that of the first fluid.

DETAILED DESCRIPTION

The hot circuit comprises pipes 8, called hot pipes, through which the first fluid can flow, and the cold circuit comprises pipes 9, through which the second fluid can flow.

The device also comprises elements 3p, 3n, called thermoelectric elements, that can be used to generate an electric current in the presence of a temperature gradient.

These are, for example, elements of substantially parallelepipedal form generating an electric current, through the Seebeck effect, when they are subjected to said gradient between two of their opposing faces 4a, 4b, called active faces. Such elements can be used to create an electric current in a load connected between said active faces 4a, 4b. As is known to the person skilled in the art, such elements are made, for example, of bismuth and of tellurium ($Bi_2Te_3$).

The thermoelectric elements are, for a first part, elements 3p of a first type, called P, making it possible to establish an electrical potential difference in one direction, called positive, when they are subjected to a given temperature gradient, and, for the other part, elements 3n of a second type, called N, making it possible to create an electrical potential difference in an opposite direction, called negative, when they are subjected to the same temperature gradient.

According to the invention, the device also comprises fins 5p, 5n, configured in a heat exchange relationship with the cold pipes 9, and the thermoelectric elements 3p, 3n are in contact, on the one hand, with the hot pipes 8 and, on the other hand, with the fins 5p, 5n, such that said thermoelectric elements 3p, 3n generate the desired current when they are subjected to a temperature gradient.

It is therefore the fins 5p, 5n which fulfill the function of establishing the thermal contact with the thermoelectric elements, for the cold circuit. As for the hot pipe 8, it can be chosen to be compatible with the flow of stressing fluids, in particular hot and/or corrosive fluids, such as exhaust gases from an engine.

A fin should be understood to be an element having two large planar opposing surfaces 7a, 7b with a thickness very much less than its width and its length, making it possible to establish a surface contact, for example, between one of said large surfaces 7a and the thermoelectric elements 3p, 3n on one 4a of their opposing faces to be subjected to a temperature gradient to generate an electric current. The fins are formed from a heat-conducting material, notably a metallic material such as copper or aluminum.

In a first embodiment, the fins 5p, 5n are coated with an electrically insulating material and are provided, on their face situated facing the thermoelectric elements, with one or more electrically conductive tracks, not represented, linking, in series and/or in parallel, the thermo-conductive elements arranged on the fin.

According to another embodiment, the fins 5p, 5n contribute by themselves to the conduction of the electricity produced by the thermoelectric elements 3p, 3n.

The hot pipes 8 will be able to be configured to establish a surface contact with the thermoelectric elements 3p, 3n on their active face 4b opposite to that 4a in contact with the fins 5p, 5n.

On this subject, said hot pipes 8 have, for example, at least one planar face 10*a*, 10*b* and said thermoelectric elements 3 are provided on said planar face or faces 10*a*, 10*b*.

Said hot pipes 8 are, notably, substantially flat pipes comprising two large parallel opposing faces 10*a*, 10*b* on which are arranged the thermoelectric elements 3*p*, 3*n*, for example, by their active face 4*b*. They will be able to be configured to allow for the flow of exhaust gas and are, notably, made of stainless steel. They are formed, for example, by profiling, welding and/or hard soldering. They will be able to have a plurality of channels for the passage of the first fluid, separated by partitions 31 (which can be seen in FIG. 4) linking the opposing planar faces 10*a*, 10*b* of the pipes. Such partitions 31 make it possible, in particular, to increase the thermal efficiency of the hot pipes 8 and reinforce their resistance to the internal pressure.

The hot pipes 8 are coated on said large faces 10*a*, 10*b* with a layer of electrically insulating material and are provided with electrically conductive tracks linking, in series and/or in parallel, all or part of the thermo-conductive elements arranged on the hot pipes 8.

The thermoelectric elements 3*p*, 3*n* are, for example, distributed in a number of ranks, parallel to one another and oriented in the longitudinal direction of the hot pipes 8, in other words, according to the axis Z illustrated in the different figures. According to the exemplary embodiments illustrated, six ranks are provided for the exemplary embodiment of FIGS. 1 and 2 and four ranks for the exemplary embodiment of FIGS. 3 and 4. It will obviously be possible to provide different numbers of ranks of thermoelectric elements, and do so regardless of the embodiment involved.

On one and the same face of a hot pipe 8, the thermoelectric elements of one and the same type, P or N, form a group of thermoelectric elements connected in parallel and the two groups of thermoelectric elements are connected in series.

The fins 5*p*, 5*n* are arranged, in particular, so as to be substantially parallel to the planar faces 10*a*, 10*b* of the hot pipes 8.

They have, for example, orifices 12 for the passage of the cold pipes 9.

Said cold pipes 9 are, for example, made of aluminum or of copper and have a round and/or oval section.

According to the exemplary embodiments illustrated, the hot pipes 8 extend, as already stated, according to an axis identified Z. Their planar faces 10*a*, 10*b* and the fins 5*p*, 5*n* extend on planar oriented according to the axis Z and an axis X orthogonal to Z. The cold pipes extend in the direction Y at a right angle to the axes X and Z, that is to say, in the direction at right angles to the fins 5*p*, 5*n* and to the large faces 10*a*, 10*b* of the hot pipes 8.

The contact between the cold pipes 9 and the fins 5*p*, 5*n* is produced, for example, by an expansion of the material of the pipes as in the heat exchangers known as mechanical heat exchangers in the field of heat exchangers for motor vehicles. In the embodiments where the conduction of electricity is produced by the fins, an electrical insulator is provided between the cold pipes 9 and the fins 5*p*, 5*n*.

Figure 2:
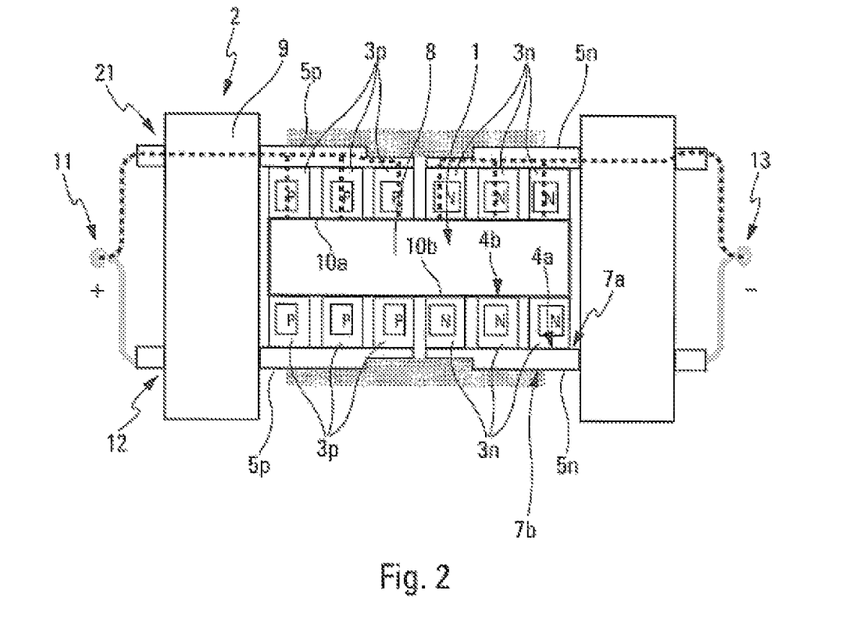

As is more particularly illustrated in FIG. 2, each planar face 10*a*, 10*b* of the hot pipes 8 has associated with it, for example, at least two so-called fins 5*p*, 5*n*, called neighboring fins, provided facing said planar face 10*a*, 10*b*, and a plurality of said thermoelectric elements 3*p*, 3*n* are provided, arranged between the planar face 10*a*, 10*b* and the neighboring fins 5*p*, 5*n* of said planar face 10*a*, 10*b*.

The P-type thermoelectric elements 3*p* of said plurality of thermoelectric elements are provided between a first 5*p* of said two fins, called P-type fin, and said planar face 10*a*, 10*b*, and the N-type thermoelectric elements of said plurality of thermoelectric elements are provided between the other 5*n* of said two fins, called N-type fin, and said planar face 10*a*, 10*b*, so as to create a potential difference between said two fins.

In this figure, each P-type fin 5*p* is associated with 3 ranks of P-type thermoelectric elements 3*p* and each N-type fin 5*n* is associated with 3 ranks of N-type thermoelectric elements 3*n*.

The subassembly consisting of a cold fin 5*p*, of one or more P-type thermoelectric elements, of a face 10*a* or 10*b* of the hot pipe 8, of one or more N-type thermoelectric elements and of a cold fin 5*n* defines a basic building block which will be able to be reproduced, the building blocks then being electrically assembled in parallel and/or in series in different ways to allow for the generation of a current exhibiting the desired intensity and/or potential difference.

Figure 1:
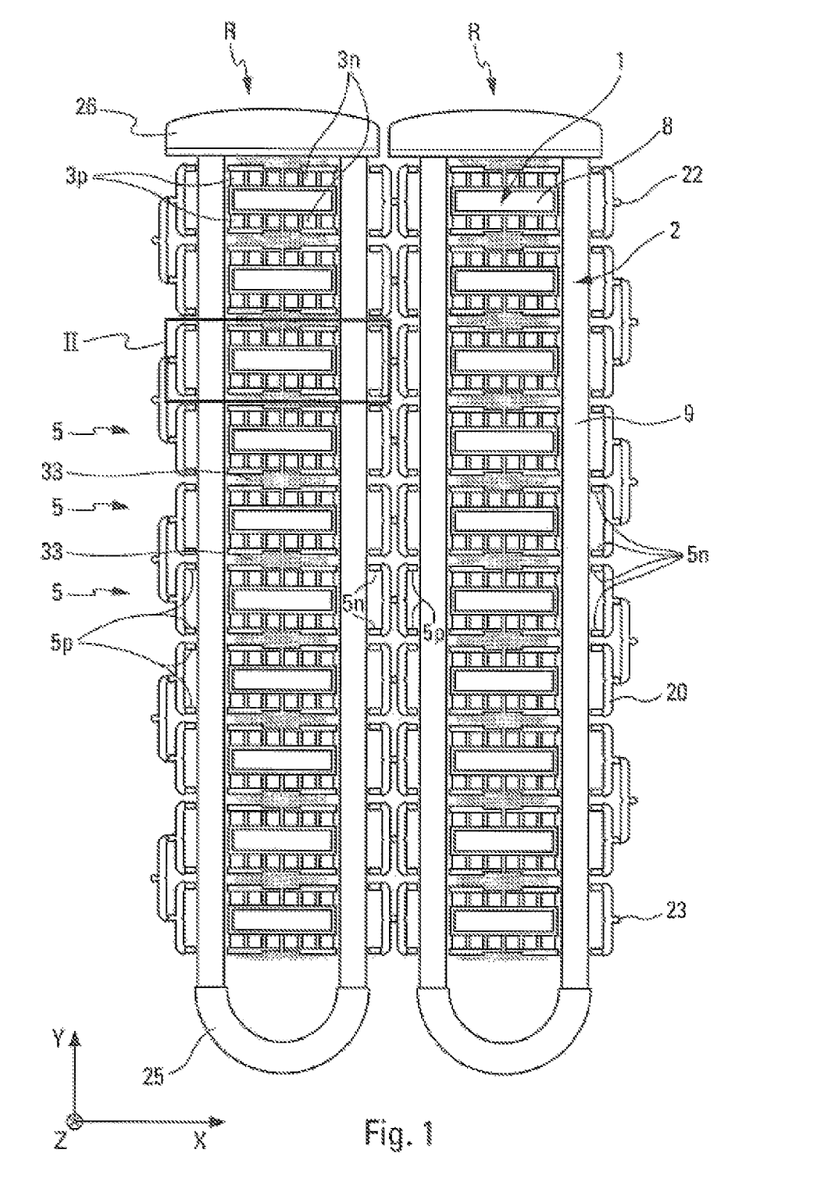
FIG. 1 schematically illustrates, in cross section, an exemplary embodiment of the device according to the invention, the cross section being made in a plane orthogonal to the longitudinal axis of the hot pipes, FIG. 2 details a part referenced II in FIG. 1, FIG. 3 schematically illustrates, in cross section, a variant embodiment of the device according to the invention, the cross section being made in a plane orthogonal to the longitudinal axis of the cold pipes, some of the elements being represented transparently.
Figure 4:
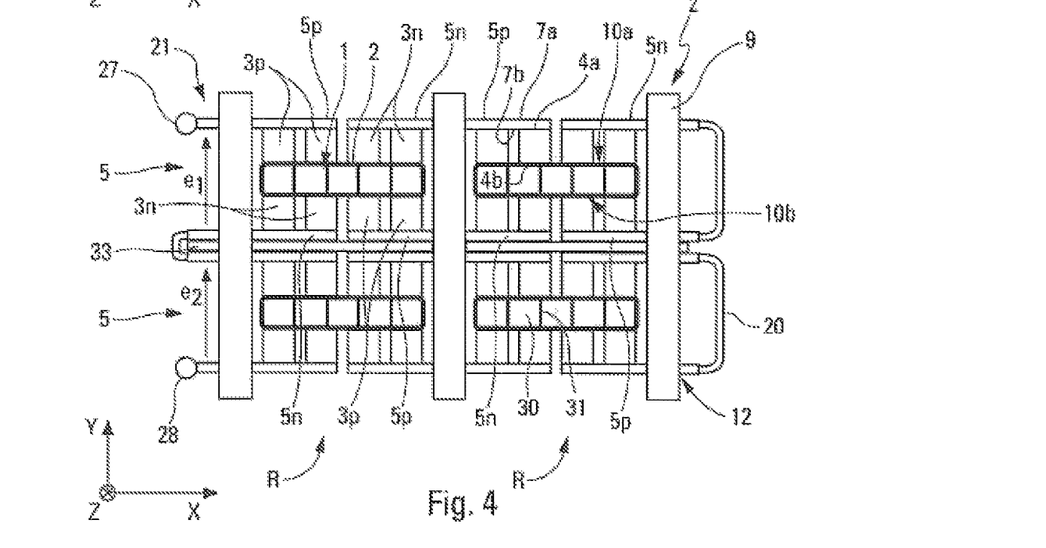
FIG. 4 is a cross-sectional view along the line IV-IV illustrated in FIG. 3.

By referring to FIGS. 1 and 4, it will be observed that said hot pipes 8 will be able to be superposed in a number of ranks R in a first direction Y orthogonal to the fins 5*p*, 5*n*.

According to the embodiments illustrated, some of said fins 5*p*, 5*n*, called internal fins, are provided between said hot pipes 8, one pair of said internal fins 5*p*, 5*n* being located between two successive hot pipes 8 of one and the same rank R. Furthermore, the fins 5*p*, 5*n* of one and the same pair 8 are separated by a compressible material 33, which will also be electrically insulating. Such a solution makes it possible to contribute to absorbing the mechanical stresses, generated in particular by the thermal stresses that the pipes 8, 9 are subjected to.

The hot pipes 8 of a so-called rank R are arranged, for example, between two ranks of said cold pipes 9, the cold pipes 9 of a first of said two ranks of cold pipes 9 being in a heat exchange relationship with the fin 5*p*, 5*n* provided on a first side of the hot pipes of said rank R and the cold pipes 9 of the second of said two ranks of cold pipes being in a heat exchange relationship with the fins 5*p*, 5*n* provided on the other side of the hot pipes 8 of said rank R.

The fins 5*p*, 5*n* have, for example, a protruding part 21 on either side of the hot pipes 8, where the cold pipes pass through the orifices 12.

We will now describe an exemplary embodiment of the arrangement of the thermoelectric elements 3*p*, 3*n* facing a given hot pipe 8 and the cold fins 5*p*, 5*n* provided to correspond, producing a first assembly of the basic building block described above.

More particularly, if we focus on the embodiment illustrated in FIGS. 1 and 2, it will be observed that said P-type fins 5*p* are located facing one another on either side of one and the same hot pipe 8 and said N-type fins 5*n* are located on either side of said same hot pipe 8. Said P-type 5*p* and N-type 5*n* fins are respectively connected together electrically so as to set the thermoelectric elements of one and the same type located on either side of said hot pipe 8 to the same potential.

In other words, for one and same hot pipe 8, the P-type thermoelectric elements 3*p* are situated facing P-type thermoelectric elements on the opposing faces 10*a*, 10*b* of the pipe and the N-type thermoelectric elements 3*n* are situated facing N-type thermoelectric elements 3*n* on the opposing faces 10*a*, 10*b* of the pipe.

For one and the same rank R of hot pipes 8, the P-type fins 5*p* are all in a heat exchange relationship, for example, with one and same rank of said cold pipes 9 whereas the N-type fins 5*n* are all in a heat exchange relationship with one and the same other rank of said cold pipes 9.

Moreover, in the case of the use of fins 5p, 5n associated in pairs, the fins 5p, 5n of one of the same pair are of the same type, P or N.

In this configuration, assuming that the positive 11 and negative 12 terminals illustrated in FIG. 2 are linked to a load, it can be considered that the thermoelectric elements associated with the hot pipe 8 generates, for each face 10a, 10b of a so-called hot pipe 8, a current flowing in the following manner, as illustrated by the dotted lines in FIG. 2. The current passes through the P-type fin 5p associated with this face and linked to the positive terminal 11, passes through the P-type thermoelectric elements 3p then via the tracks provided on the pipe to the N-type thermoelectric elements 3n situated on the same face to continue via the N-type fin 5n, linked to the negative terminal 12, to create a potential difference between the positive 11 and negative 12 terminals. The thermoelectric elements situated on either side of the hot pipe 8 are mounted in parallel, thus delivering two times more current than in the case of a series assembly (see embodiment of FIGS. 3 and 4).

The hot pipes 8 will be able to be situated facing one another from one rank R of hot pipes to the other so as to form a series S of hot pipes 8 located in the extension of one another in a direction of transversal extension X of the fins 5p, 5n.

The fins 5p, 5n of one and the same type, P or N, located on either side of one and the same hot pipe 8 of a rank R of hot pipes are situated facing fins 5p, 5n of one and the same type, P or N, located on either side of the hot pipe 8 situated opposite in the rank R of neighboring hot pipes, in one and the same series S of hot pipes.

Said fins 5p, 5n of one and the same type located on either side of one and the same hot pipe 8 of a rank R of hot pipes and the fins 5p, 5n situated in the extension in the rank R of neighboring hot pipes 8 will then be able to be set to the same potential.

In one and the same series S of hot pipes, said fins 5p, 5n of one and the same type located on either side of one and the same hot pipe 8 of a rank R of hot pipes and the fins situated facing one another in the rank R of neighboring hot pipes are, for example, respectively, fins of different type, P or N. In other words, the P-type fins 5p are facing N-type fins 5n in the direction X, from one rank R of hot pipes to the other.

The fins 5p, 5n located on either side of one and the same hot pipe 8, situated at the end of a series S of hot pipes, are set to the same potential as the fins 5p, 5n situated at the end of the neighboring series S of hot pipes, on one side of said series S of hot pipes.

In the exemplary embodiment illustrated, the series S are electrically connected in series from one series to the other, by their fins 5p, 5n located on either side of the hot pipe 8 situated at the end of the series S. The device has two positive 22 and negative 23 electrical connection terminals, respectively provided on the fins, notably P-type 5p, of the hot pipe 8 located at one of the ends of the first series S, in the direction Y of the ranks R of hot pipes, and on the fins, notably P-type 5p, of the hot pipe 8 located at one of the ends of the last series S, in the direction Y, of the ranks R of hot pipes.

The thermoelectric elements 3p, 3n are thus electrically associated in parallel on one and the same hot pipe 8, as already stated, then in series from one hot pipe 8 to the other in the same series S of hot pipes and from one series S to the other. The potential difference that exists between the positive 22 and negative 23 terminals is thus the resultant of the potential difference created on each hot pipe 8. In this way, the greater the number of ranks R and series S of hot pipes, the higher the potential difference created at the terminals of the device. The greater the number of thermoelectric elements associated with each pipe, the greater the intensity of the current that the device can deliver.

Two ranks of cold pipes 9 are, for example, provided between each rank R of hot pipes 8. Said cold pipes 9 provided on either side of one and the same rank R of hot pipes will be able to be linked together by a bent part 25 and form fluid circulation hairpins linked to collecting boxes 26. Each box is divided into two volumes, a first fluid inlet volume linked to one of the cold pipes and a second fluid outlet volume linked to the other cold pipe.

Figure 5:
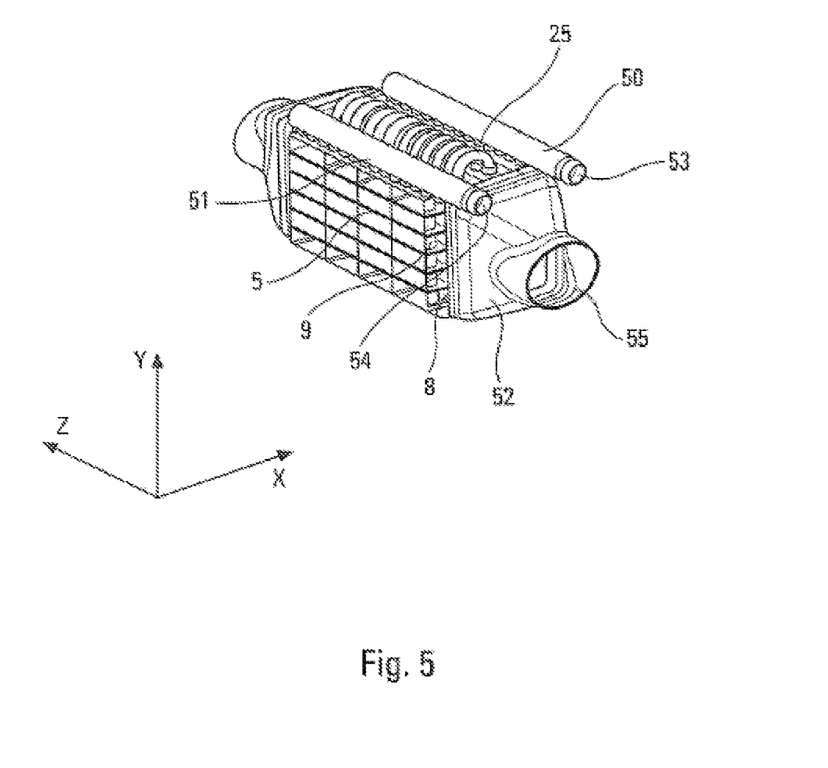
FIG. 5 illustrates, in perspective, an exemplary device according to the invention.

The hot pipes are linked, at each of their ends, to a collecting box, which can be seen in FIG. 5.

Figure 3:
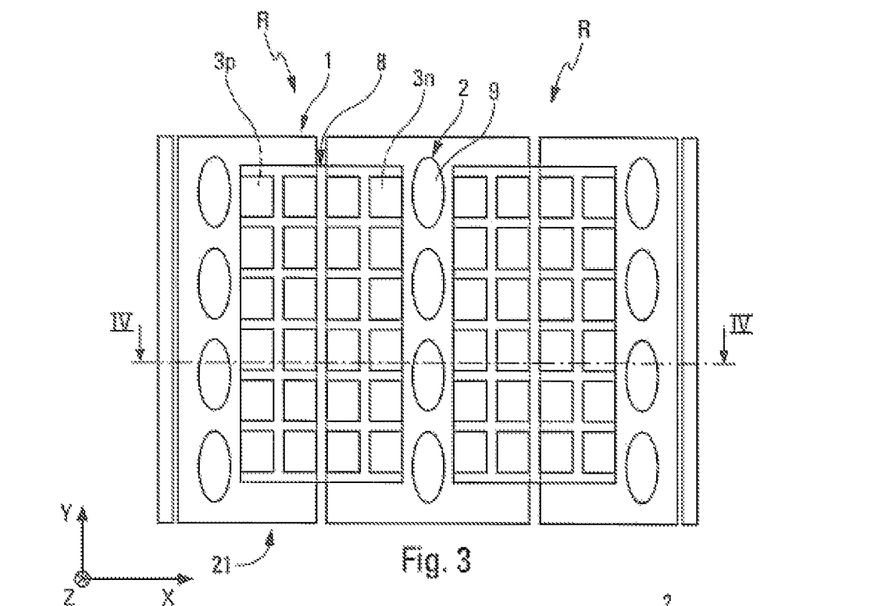

With reference now to the embodiment of FIGS. 3 and 4, there will be observed that, according to another electrical connection method, said P-type fins 5p are located facing said N-type fins 5n on either side of one and the same hot pipe 8. In other words, the P-type thermoelectric elements 3p are situated facing N-type thermoelectric elements 3n on the opposing faces 10a, 10b of the hot pipe 8.

In such an embodiment, in the case of use of fins associated in pairs, the fins of one and the same pair are of different types, one P-type and the other N-type, or vice versa.

Here again, the hot pipes 8 are situated facing one another from one rank R of hot pipes to the other so as to form a series S of hot pipes located in the extension of one another in the direction X of transversal extension of the fins 5p, 5n. On the other hand, the P-type fins 5p, respectively N-type 5n, of a so-called hot pipe are merged with the N-type fins 5n, respectively P-type 5p, of the hot pipe of the neighboring rank R, in the same series S of hot pipes.

The fins 5p, 5n located on either side of the hot pipe 8 situated at the end of a series S of hot pipes are electrically connected together in series.

The fins 5p, 5n located on either side of one and the same hot pipe 8, situated at the end of a series S of hot pipes, are set to the same potential, on one side of the series S of hot pipes and the fins 5p, 5n located on either side of one and the same hot pipe 8, situated at the other end of the series S of hot pipes, are set to the same potential as the fins 5p, 5n of the neighboring hot pipe of the preceding and/or next series S of hot pipes.

In other words, in one and the same series S of hot pipes, the fins 5p, 5n are mounted in series, a potential difference e1, e2 being created, on the side of the series S of hot pipes where the two fins not connected together are located, between said two fins that are not connected together. Also, the different series S of hot pipes are connected in series together.

The potential difference that exists between the positive 27 and negative 28 terminals is the resultant of the potential difference created on each hot pipe 8, which corresponds to the sum of the potential differences created on each of its faces 10a, 10b. Thus, the greater the number of ranks R and series S of hot pipes, the higher the potential difference created at the terminals of the device. The greater the number of thermoelectric elements associated with each fin, the greater the intensity of the current that the device can deliver.

In this embodiment, a single rank of cold pipes 9 is provided between each rank R of hot pipes.

The hot and cold pipes are respectively linked to collecting boxes, which are not represented.

That said, it will be possible to provide for the fins 5p, 5n to have a reduced thickness on moving away from the cold pipe 9 with which they are in contact. There may be fins with two thicknesses, one greater on the ranks of thermoelectric elements 3p, 3n closest to the cold pipe 9 and one lesser on the ranks of thermoelectric elements 3p, 3n furthest away from the cold pipe 9. Such an arrangement makes it possible to have a more constant heat exchange on each rank of thermoelectric elements 3p, 3n.

In the preceding embodiments, the cold fins 5f-p, 5f-n provided facing one and the same planar face 10a or 10b are two distinct components. In other words, two distinct fins are provided facing each face 10a, 10b of one and the same hot pipe 8. In a variant which is not illustrated, these fins consist of one and the same component. In other words, a single fin is provided facing each of the faces of one and the same pipe 8. In such a variant, it is not the fins that conduct the electricity generated by the thermoelectric elements, but necessarily the tracks, provided on their surface, in contact with said elements. More specifically, the tracks in contact with the P-type thermoelectric elements are distinct from tracks in contact with the N-type thermoelectric elements in order to avoid any short circuit. In such a variant, in the case of use of a number of hot pipes 8 situated in the extension of one another in one and the same series S, it will be possible to provide a fin 5 common to all these hot pipes 8, for each of their faces 10a, 10b, the tracks being configured on each of the fins to set the thermoelectric elements of the same type, P or N, of neighboring hot pipes 8 to the same potential.

In the above, the expression "electrically connected" or "set to the same potential" should be understood to mean that the fins are connected to one another in the case where it is they which conduct the electricity or that the tracks provided on the fins are connected together from one fin to the other when the fins are provided with conducting tracks, for example using connection lugs and electrical conductors 20.

As illustrated in FIG. 5, the ranks of cold pipes are distributed in ranks according to the planar extending in the directions Y and Z, the cold pipes of successive ranks located in one and the same plane extending in the directions X and Y being linked in series by bent parts 25. The cold pipes of ranks located on either side of the device, in the direction X, are linked to an inlet 50 and outlet 51 manifold, respectively provided with an inlet 53 and an outlet 54 for the heat transfer fluid.

The hot pipes are linked at each of their ends to collecting boxes 52 provided with an inlet/outlet 55.

The invention claimed is:

1. A thermoelectric device, comprising pipes, called hot pipes, through which a first fluid can flow, and elements, called thermoelectric elements, that can be used to generate an electric current in the presence of a temperature gradient, wherein the thermoelectric device comprises fins that can be configured in a heat exchange relationship with pipes, called cold pipes, through which a second fluid can flow at a temperature lower than that of the first fluid, and in that the thermoelectric elements are in contact, on the one hand, with the hot pipes and, on the other hand, with the fins, such that said thermoelectric elements generate said current, in which said hot pipes have at least one planar face and said thermoelectric elements are provided on said face or faces.

2. The device as claimed in claim 1, in which said hot pipes are substantially flat and have two opposing planar faces, said thermoelectric elements being provided on said planar faces.

3. The device as claimed in claim 2, in which said hot pipes have a plurality of channels for the passage of the first fluid, separated by partitions linking the opposing planar faces of the pipes.

4. The device as claimed in claim 1, in which said hot pipes are made of stainless steel.

5. The device as claimed in claim 2, in which the thermoelectric elements are, for a first part, of a first type, called P, making it possible to establish an electrical potential difference in one direction, called positive, when they are subjected to a given temperature gradient, and, for the other part, of a second type, called N, making it possible to create an electrical potential difference in an opposite direction, called negative, when they are subjected to the same temperature gradient.

6. The device as claimed in claim 5, in which:
each planar face of the hot pipes has associated with it at least two adjacent fins, called neighboring fins, provided facing said face,
a plurality of said thermoelectric elements are provided, arranged between the planar face and the neighboring fins of said planar face,
the P-type thermoelectric elements of said plurality of thermoelectric elements are provided between a first of said two fins, called P-type fin, and said planar face,
the N-type thermoelectric elements of said plurality of thermoelectric elements are provided between the other of said two fins, called N-type fin, and said planar face,
so as to create a potential difference between said first and other fins.

7. The device as claimed in claim 6, in which a number of ranks R comprise hot pipes, and in which said hot pipes are superposed with at least one of the thermoelectric elements in a number of ranks R in a first direction orthogonal to the neighboring fins.

8. The device as claimed in claim 7, in which a plurality of partitions are provided between said hot pipes, a pair of said partitions being located between two successive hot pipes of one and the same rank R, the partitions of one and the same pair being separated by a compressible material.

9. The device as claimed in claim 7, wherein said neighboring fins are in a heat exchange relationship with said cold pipes.

10. The device as claimed in claim 9, in which said cold pipes are round or oval.

11. The device as claimed in claim 9, in which the hot pipes of a so-called rank R are arranged between two ranks of said cold pipes, the cold pipes of a first of said two ranks of cold pipes being in a heat exchange relationship with the fins provided on a first side of the hot pipes of said rank R and the cold pipes of the second of said two ranks of cold pipes being in a heat exchange relationship with the fins provided on the other side of the hot pipes of said rank R.

12. The device as claimed in claim 9, in which said P-type fins are located facing one another on either side of one and the same hot pipe and said N-type fins are located on either side of said same hot pipe, said P-type and N-type fins being respectively connected together electrically so as to set the thermoelectric elements of one and the same type located on either side of said pipe at the same potential.

13. The device as claimed in claim 12, in which:
a plurality of ranks R each comprises hot pipes and the hot pipes are situated facing one another from a rank R of hot pipes to another rank R of hot pipesthe other so as to form a series S of hot pipes located in the extension of one another in a direction of transversal extension of the fins, the fins of one and the same type located on either side of one and the same hot pipe of a rank R of hot pipes are situated facing fins of one and the same type located on either side of the hot pipe situated opposite in the rank R of neighboring hot pipes, in the same series S of hot pipes, said fins of one and the same type located on either side of one and the same hot pipe of a rank R of hot pipes and the fins situated facing one another in the rank R of neighboring hot pipes are set to the same potential.

14. The device as claimed in claim 13, in which:

said fins of one and the same type located on either side of one and the same hot pipe of a rank R of hot pipes and the fins situated facing one another in the rank R of neighboring hot pipes are, respectively, fins of different type, P or N, the fins situated at the end of a series S of hot pipes are set to the same potential as the fins situated at the end of the neighboring series S of hot pipes, on one side of said series S of hot pipes.

15. The device as claimed in claim 13, in which a rank comprises cold pipes and two ranks of cold pipes are provided between each rank R of hot pipes.

16. The device as claimed in claim 9, in which said P-type fins are located facing said N-type fins on either side of at least one of said hot pipes.

17. The device as claimed in claim 16, in which:

the hot pipes are situated facing one another from a rank R of hot pipes to another rank R of hot pipes so as to form a series S of hot pipes located in the extension of one another in a direction of transversal extension of the fins, the P-type, respectively N-type, fins of a so-called hot pipe are merged with the N-type, respectively P-type, fins of the neighboring hot pipe of the same series S of hot pipes.

18. The device as claimed in claim 17, in which the fins located on either side of the hot pipe situated at the end of a series S of hot pipes are electrically connected together in series.

19. The device as claimed in claim 18, in which a plurality of ranks each comprises cold pipes and at least one of the ranks of cold pipes is provided between each rank R of hot pipes.

* * * * *

UNITED STATES PATENT AND TRADEMARK OFFICE
CERTIFICATE OF CORRECTION

PATENT NO. : 9,698,330 B2
APPLICATION NO. : 13/876685
DATED : July 4, 2017
INVENTOR(S) : Michel Simonin et al.

It is certified that error appears in the above-identified patent and that said Letters Patent is hereby corrected as shown below:

On the Title Page

Inventors, please delete "Michel Simonn" and replace with -- Michel Simonin --.

Inventors, please update order of inventors. Michel Simonin should be listed as the first named inventor and Kamel Azzouz should be listed as the second named inventor.

Assignee, please delete "Valed" and replace with -- Valeo --.

In the Claims

Claim 13, Column 10, Line 64, please delete "pipesthe other so" and replace with -- pipes so --.

Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*